(12) United States Patent
Kahl et al.

(10) Patent No.: US 7,729,491 B2
(45) Date of Patent: Jun. 1, 2010

(54) METHOD AND DEVICE FOR AMPLIFYING A RECEPTION SIGNAL

(75) Inventors: Alexander Kahl, Landskron (AT); Peter Pessl, Nöstl Bei Weiz (AT); Sergio Walter, Villach (AT)

(73) Assignee: Infineon Technologies AG, Munich (DE)

( * ) Notice: Subject to any disclaimer, the term of this patent is extended or adjusted under 35 U.S.C. 154(b) by 1471 days.

(21) Appl. No.: 11/057,089

(22) Filed: Feb. 11, 2005

(65) Prior Publication Data

US 2005/0191981 A1    Sep. 1, 2005

(30) Foreign Application Priority Data

Feb. 12, 2004    (DE) ........................ 10 2004 006 957

(51) Int. Cl.
*H04M 1/00*    (2006.01)
*H04M 9/00*    (2006.01)

(52) U.S. Cl. .................................. 379/395; 379/390.02

(58) Field of Classification Search ................. 379/394, 379/399.01, 395, 390.02; 375/344, 345
See application file for complete search history.

(56) References Cited

U.S. PATENT DOCUMENTS 6,226,322 B1 *   5/2001   Mukherjee ................... 375/229
6,583,662 B1 *   6/2003   Lim ............................ 327/553

FOREIGN PATENT DOCUMENTS

EP    1 298 795 A2    4/2003

* cited by examiner

*Primary Examiner*—Alexander Jamal
(74) *Attorney, Agent, or Firm*—Maginot, Moore & Beck

(57) ABSTRACT

A method and a device for amplifying a reception signal are provided, involving the adjustment of a gain by which the reception signal is amplified, in particular as a function of a signal level of the reception signal. For example, lowpass filtering with a variable cutoff frequency is used to filter out a gain-dependent frequency range of the reception signal, which may especially contain an undesirable echo signal. Such a method and such a device are suitable in particular for the reception of ADSL signals in a central office.

18 Claims, 2 Drawing Sheets

METHOD AND DEVICE FOR AMPLIFYING A RECEPTION SIGNAL

FIELD OF THE INVENTION

The present invention relates to a method and to a device for amplifying a reception signal, particularly for amplifying an ADSL reception signal which is received in a central office from a subscriber connection.

BACKGROUND

In an analog signal path which comprises amplifier stages and filter stages, it is desirable to carry out as much as possible of the required amplification in a first amplifier stage in order to optimize the signal-to-noise ratio. This also applies in particular to a reception line of an xDSL ("digital subscriber line") device, or an xDSL modem. In the event of large amplification, however, care must be taken to ensure that the elements following this first stage in the analog signal path are not overloaded. This may particularly be the case for integrated circuits with a low current supply. It may be therefore necessary to amplify the signal, then filter it or process it in another way, and then amplify it again. This, however, is not optimal for the signal-to-noise ratio.

A particular problem occurs here in reception devices, especially of ADSL central offices. The transmission power spectrum p is represented as a function of the frequency $f_s$ for ADSL communication by way of example in FIG. 3. Between frequencies f1 and f2, there is a first frequency band 5 for the data transmission from a terminal or a subscriber connection to the central office (the so-called upstream direction), above which there is a second frequency band 6 between the frequency $f_2$ and a frequency $f_3$ for the data transmission from the central office to the subscriber connection (the so-called downstream direction). The second frequency band 6 here covers a larger frequency range than the first frequency band 5, since more data normally have to be transmitted from the central office to the terminal than in the opposite direction. These frequencies f1, f2 and f3 may depend on the ADSL standard being used, and on whether the ADSL transmission is taking place on a conventional telephone line (POTS, "plain old telephone system") or on an ISDN line. For ADSL combined with ISDN, for example, $f_1$ is 138 kHz, $f_2$ is 276 kHz and $f_3$ is 1104 kHz.

Owing to the frequency distribution as represented in FIG. 3, there is a dominant echo of the transmission signal in a reception signal path of the central office, that is to say a signal lying in the second frequency band 6. This signal thus makes up a large part of the energy in the reception signal and of a peak voltage. This means that the echo signal crucially determines how great the amplification can be in a first stage of the reception signal path, in order to avoid overloading a subsequent analog-digital converter. This leads to the aforementioned problem regarding the signal-to-noise ratio.

There are two known ways of attenuating this effect and this dominance of the echo signal:
1. A hybrid circuit for two-wire/four-wire conversion, that is to say for separating a signal present in a transmission line into the reception signal and a transmission signal, may be optimised so that as little echo signal as possible enters the reception path. This option is limited both on the technical side and on the cost side.
2. Lowpass filtering may be carried out before the amplification, in order to filter out the echo signal as much as possible. Such a reception path is schematically represented in FIG. 4.

A reception signal a is in this case delivered to a lowpass filter 7, which is intended to filter out the echo signal that the reception signal contains. A signal e obtained in this way is then delivered to an amplifier unit 8 which amplifies the signal e according to requirements, in particular according to its signal strength. The resulting signal f may be filtered again by a filter unit 9, and the signal g provided at the output of the filter unit 9 is then converted by an analog-digital converter 3 into a digital signal h for further processing.

The lowpass filter 7 must have a relatively low cutoff frequency here, close to f2 in FIG. 3, so that it always filters out as much of the echo signal as possible. This requires relatively large resistances and capacitances, the effect of which is that the lowpass filter 7 on the one hand requires a large chip area and, on the other hand, it is difficult to optimise in terms of the signal-to-noise ratio because the cutoff frequency is set.

SUMMARY

It is therefore an object of the present invention to provide a method and a device for amplifying a reception signal having the features of embodiments of the invention.

In accordance with the invention, in order to amplify a reception signal it is proposed that a gain should be adjusted, in particular as a function of a signal level of the reception signal, and that a gain-dependent frequency range of the reception signal should be filtered out. It may, in particular, be filtered out by means of lowpass filtering with a gain-dependent cutoff frequency. Echo signals can be filtered out in this way, especially for the case of receiving the reception signal in a central office from a terminal as described in the introduction to the description. Other gain-dependent frequency ranges are nevertheless conceivable for other applications, for example highpass filtering for the converse case of a reception signal in the terminal.

For lowpass filtering, in particular, it is advantageous to reduce the cutoff frequency when the gain is increased. A low cutoff frequency is needed, especially with a high gain, in order to filter out as many spurious signals as possible which could lead to overloading of subsequent signal processing units. With a lower gain, however, this cutoff need not be selected so stringently.

A device in accordance with the invention comprises amplifier means whose gain is adjustable, and filter means for filtering out a gain-dependent frequency range of the reception signal, in particular lowpass filter means. Control means may also be provided for controlling the gain as a function of a signal level of the reception signal.

The amplifier means may in particular comprise an operational amplifier in which a resistance of a feedback path is configured to be variable, so as to be able to adjust the gain. In order to form the lowpass filter means, a capacitance may be connected in parallel with this variable resistance in the feedback path. Together with the variable resistance, this capacitance forms a lowpass filter whose cutoff frequency is varied by adjusting the variable resistance. A compact structure of the filter means and the amplifier means is therefore possible, since one variable resistance can fulfil two functions, namely to adjust the gain and to adjust the cutoff frequency.

The variable resistance may in particular be formed by a multiplicity of switchable resistors connected in parallel, in which case the switching may particularly be carried out using CMOS switches.

A resistance in an input line of the amplifier may likewise be configured to be switchable in order to compensate for effects due to switching means of the switchable resistors in the feedback path.

BRIEF DESCRIPTION OF THE DRAWINGS

The invention will be explained in more detail below with the aid of preferred embodiments, with reference to the appended drawings in which.

DETAILED DESRIPTION

Figure 1:
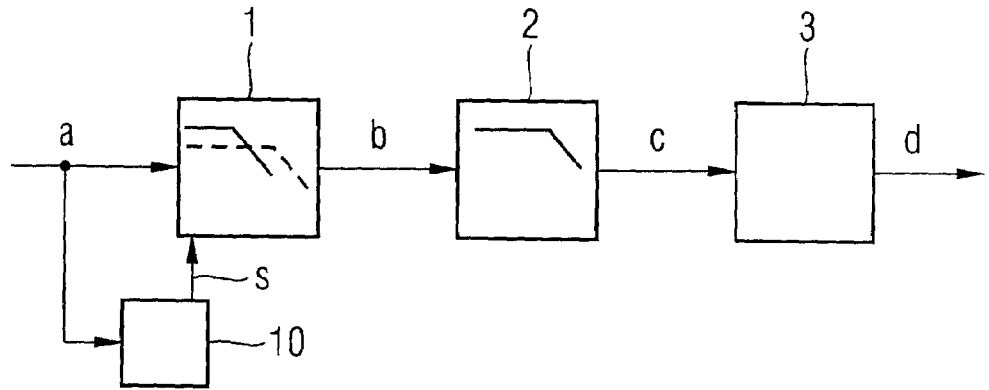
FIG. 1 shows an analog reception path having an amplifier unit in accordance with the invention.

FIG. 1 shows an analog reception path, for example of an ADSL modem in a central office. A reception signal a is in this case delivered to an amplifier unit 1 in accordance with the invention. The input signal b amplified in this way is filtered by an anti-aliasing filter 2; the input signal c thus filtered is delivered to an analog-digital converter 3 which then provides the digitised input signal d for further processing. The reception signal a is also delivered to a control unit 10 which controls a gain of the amplifier unit 1 in accordance with the invention as a function of a signal level of the reception signal a.

If the reception signal a is coming from a subscriber terminal to which a relatively short line leads, for example, then it will have a relatively high signal level. Accordingly, the control instrument 10 will operate the amplifier unit 1 so that it amplifies the reception signal a only relatively little. If the reception signal a is coming from a subscriber connection far away, however, then it will have a relatively low signal level. Accordingly, the control unit 10 operates the amplifier unit 1 so that it amplifies the reception signal a with a high gain. Here, the control unit 10 may also be integrated directly into the amplifier unit 1.

In this context, it should be noted that instead of the reception signal a, the control unit 10 may also evaluate the amplified input signal b, the filtered input signal c or the digitized input signal d in order to adjust the gain, since these signals also contain information about the signal level of the input signal a, for example. When using the digitized input signal d, in particular, the evaluation in the control unit 10 may be carried out digitally, for example with suitable software using an appropriate evaluation algorithm.

Figure 3:
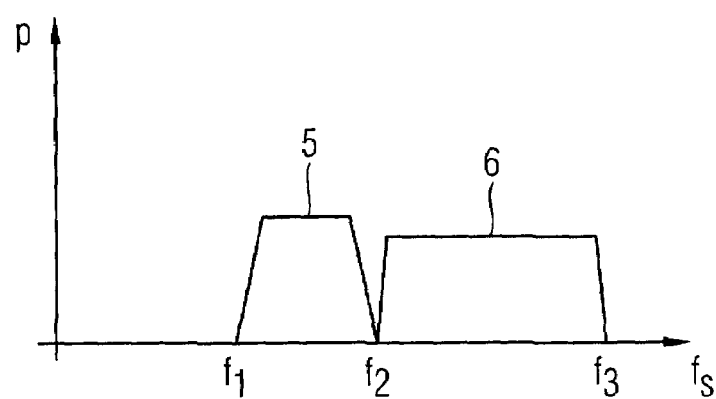
FIG. 3 shows an example of the positions of frequency bands for ADSL transmission.
Figure 4:
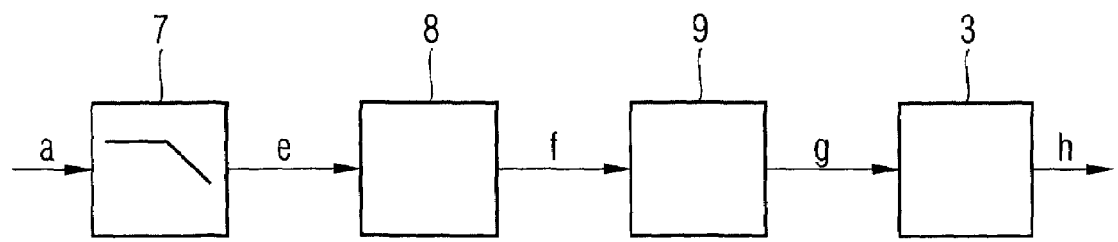
FIG. 4 shows an analog reception path according to the prior art.

As a function of the gain, the amplifier unit 1 in accordance with the invention also carries out variable filtering of the signal, which in the example of an ADSL reception path in a central office is lowpass filtering with a variable cutoff frequency. Particularly for a high gain, a low cutoff frequency is set so that echo signals which lie in a higher frequency band, as already described with reference to FIG. 3 in the introduction, can be filtered out as fully as possible. But the cutoff frequency will be higher if the gain is relatively low, since the echo signal cannot so rapidly lead to overdrive of the analog-digital converter 3 because of the lower gain, and a lowpass filter with a higher cutoff frequency is in this case more favourable for the signal-to-noise ratio of the signal being generated.

Figure 2:
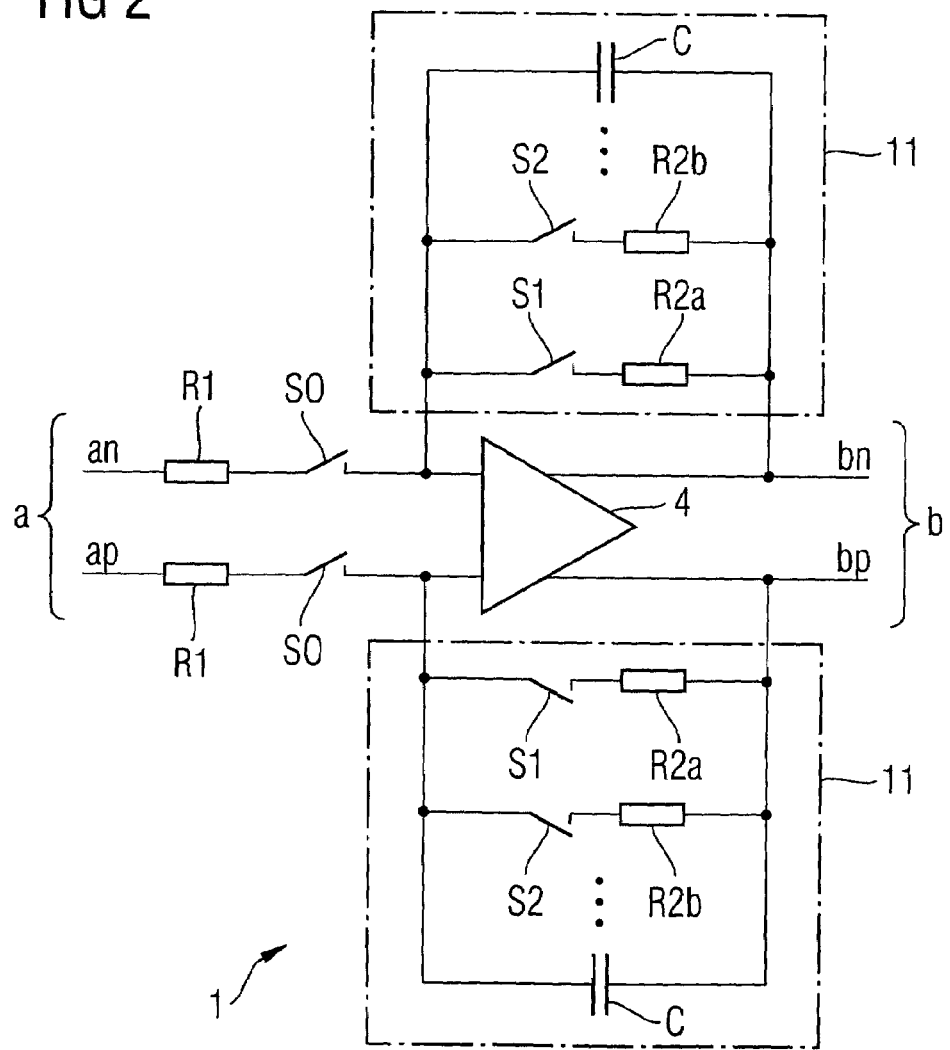
FIG. 2 shows an embodiment of an amplifier unit in accordance with the invention.

FIG. 2 represents an embodiment of the amplifier unit 1 in FIG. 1. This embodiment is configured for the processing of differential signals, that is to say the reception signal a is made up of the signal components ap and an; the amplified reception signal b is correspondingly also a differential signal with signal components bp and bn. The amplification and filtering of the signal components are then carried out symmetrically. A so-called "single-ended" configuration in which, so to speak, half the device as represented is then used, is also conceivable in principle.

The signal components an, ap are delivered through resistors R1 to an operational amplifier 4, which emits the amplified signal components bp and bn at its outputs. The input path may optionally contain switching means S0, especially CMOS switches, although these are always closed for delivering the signals during operation of the amplifier unit 1, and their function will be explained later.

Each signal component is provided with a feedback path 11 which connects a respective output of the operational amplifier 4 to the corresponding input. Each of these two feedback paths 11 consists of a parallel circuit comprising a capacitor C and a plurality of resistors R2a, R2b, . . . , with branches of the individual resistors being switchable by switching means S1, S2, . . . . These switching means S1, S2, . . . are in this case preferably configured as CMOS switches or MOS transistors, although other switching means such as a bipolar transistors are also conceivable in principle.

In order to ensure equivalent amplification of the signal component an and of the signal component ap, switches with the same reference are opened and closed together so that the switching state in both feedback paths 11 is the same.

The resistors R2a, R2b, . . . preferably have different values. In this case, for example, one of the switches S1, S2, . . . may always respectively be closed while the other switches S1, S2, . . . are open. The resistors R1 should be selected to be as small as possible in order to ensure minimal noise of the amplified signal. There is a lower limit on the value of the resistors R1 in practice, for example due to a particular required security against electrostatic discharges, and this may for example be 300 Ω.

The gain of the amplifier unit 1 depends on the value of the total resistance in the feedback path, which will be denoted here by R2. If only one of the switching means S1, S2, . . . is closed, then R2 has the value of the resistor assigned to the corresponding closed switching means. Otherwise R2 is calculated in the known way from those of the resistors R2a, R2b, connected in parallel whose switching means S1, S2, . . . are closed. The gain is then proportional to R2/R1.

The switching means S1, S2, . . . themselves have a certain effect here, since they do actually have some impedance. Especially in the case of a small gain, that is to say a small value of R2 (for example R2 of the order of R1), it is therefore necessary to ensure that the impedance of the switching means is small compared with R2, in order to facilitate accurate adjustment of the gain and to reduce nonlinear effects which could cause distortion of the signals. The effect of the switching means is even less for larger gains (R2>>R1). The aforementioned switching means S0, which are likewise configured as CMOS switches, may also be provided at the inputs of the operational amplifier. These switching means S0 can compensate at least partially for any perturbing effect due to the switching means S1, S2, . . . .

Together with the resistors R2a, R2b, . . . , the capacitors C in the two feedback paths 11 form a first-order lowpass filter. The cutoff frequency of this lowpass filter is proportional to $1/(C \cdot R2)$. This means that the cutoff frequency also changes when the gain is adjusted by opening and closing the switching means S1, S2, . . . . In particular the behaviour can then correspond precisely to the intended response. With a higher gain, that is to say a larger value of R2, the cutoff frequency of the lowpass filter is reduced. Here, naturally, suitable dimensioning of the resistors R2a, R2b, . . . and of the capacitor C should be used to ensure that the actual reception signal to be processed is not filtered out, but only perturbing components such as the aforementioned echo signal are filtered out.

The amplifier unit 1 thus fulfils precisely the requirements for the reception of ADSL signals in a central office from a subscriber connection, it moreover exhibits little noise and the lowpass filtering is accurately adapted to the requirements for the gain in question. In particular, this makes it possible for even weak reception signals to be amplified with a high gain and low distortion, without overloading the subsequent analog-digital converter 3 in FIG. 1. The result in this case is an amplified reception signal b with a low signal-to-noise ratio.

Such an amplifier unit also makes it possible to shift the cutoff frequency of the anti-aliasing filter 2 to higher values, the effect of which is that smaller resistors and capacitors can be used to form this anti-aliasing filter, and less chip area is therefore required. Furthermore, this cutoff frequency does not need to be adjusted so accurately, which may allow more cost-effective fabrication since the component tolerances are less critical.

The present invention is not of course limited to the embodiment which has been presented. A different kind of gain-dependent filter may be used if undesired signals lie in ranges other than above the actual reception signal, for example a highpass or a bandbass filter with variable cutoff frequencies. The variable resistor R2 likewise need not be formed by a parallel circuit of the resistors R2a, R2b, . . . , and any other kind of variable resistor is also conceivable in principle.

The invention claimed is:

1. A method of amplifying a reception signal in order to avoid overloading a subsequent signal processing unit, the method comprising adjusting a gain by which the reception signal is amplified, generating an amplified reception signal at the adjusted gain using an amplifier, and filtering out a gain-dependent frequency range of the reception signal when generating the amplified reception signal using a filter positioned in parallel with the amplifier, wherein the filtering step utilizes lowpass filtering with a gain-dependent cutoff frequency, and wherein the filtering step comprises lowering the cutoff frequency when the gain is increased and increasing the cutoff frequency when the gain is lowered.

2. The method of claim 1, wherein the gain adjusting step includes adjusting the gain as a function of a signal level of the reception signal.

3. The method of claim 1, wherein the generating step utilizes an operational amplifier to amplify the reception signal which operational amplifier has a feedback path comprising a parallel circuit having a capacitance and a variable resistance and further comprising varying the variable resistance to adjust the gain and the cutoff frequency.

4. The method of claim 1, wherein the frequency range comprises a range of an echo signal contained in the reception signal.

5. The method of claim 1, wherein the method is carried out to amplify an xDSL reception signal.

6. The method of claim 5, further comprising receiving at a central office the xDSL reception signal from a subscriber connection and amplifying the received signal at the central office.

7. The method of claim 5, wherein the method is carried out to amplify an ADSL reception signal.

8. An amplifier for amplifying a reception signal in order to avoid overloading a subsequent signal processing unit, the amplifier comprising an amplifier circuit coupled at an input to the reception signal for amplifying the reception signal to generate an amplified reception signal, a gain adjusting circuit coupled to the amplifier circuit and configured to adjust the gain by which the reception signal is amplified by the amplifier circuit, and a filter circuit coupled to the amplifier circuit in a feedback path comprising a parallel circuit including a capacitance and a variable resistance which when varied adjusts the gain and the cut-off frequency, the filter circuit configured to filter out a gain-dependent frequency range of the reception signal when generating the amplified reception signal, wherein the filter circuit is configured to provide low-pass filtering with a gain-dependent cutoff frequency, and wherein the filter circuit is configured to lower the cutoff frequency when the gain is increased and increase the cutoff frequency when the gain is lowered.

9. The device of claim 8, further comprising a control circuit configured to adjust the gain as a function of a signal level of the reception signal.

10. The device of claim 8, wherein the filter circuit comprises a lowpass filter.

11. The device of claim 8, wherein the amplifier circuit comprises an operational amplifier.

12. The device of claim 11, further comprising a feedback path coupled to the operational amplifier, the feedback path comprising a parallel circuit including a capacitance and a variable resistance which when varied adjusts the gain and the cut-off frequency.

13. The device of claim 12, wherein the filter circuit comprises a low pass filter formed by the capacitance and variable resistance of the feedback path, further comprising a control circuit configured to adjust the gain of the amplifier as a function of a signal level of the reception signal, the control circuit being coupled to the variable resistance to vary the variable resistance to adjust both the gain and a cutoff frequency of the lowpass filter.

14. The device of claim 12, wherein the variable resistance comprises a parallel circuit of a plurality of switchable resistors.

15. The device of claim 14, wherein at least one of the plurality of switchable resistors is connected in series with a switch.

16. The device of claim 15, wherein the switch comprise CMOS components.

17. The device of claim 15, further comprising an input switch in an input path of the operational amplifier the input switch being configured to at least partially compensate for any effect on the gain due to the switch in the feedback path.

18. The device of claim 8, wherein the device is configured for amplifying a differential input signal.

* * * * *